United States Patent
Ikeda et al.

(10) Patent No.: US 6,906,589 B2
(45) Date of Patent: Jun. 14, 2005

(54) MULTISTAGED AMPLIFICATION CIRCUIT

(75) Inventors: Takeshi Ikeda, Tokyo (JP); Hiroshi Miyagi, Kanagawa (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/605,571

(22) Filed: Oct. 9, 2003

(65) Prior Publication Data

US 2004/0160276 A1 Aug. 19, 2004

Related U.S. Application Data

(63) Continuation of application No. PCT/JP02/03619, filed on Apr. 11, 2002.

(30) Foreign Application Priority Data

Apr. 16, 2001 (JP) ........................................ 2001-116418

(51) Int. Cl.[7] ................................................ H03F 3/45
(52) U.S. Cl. ........................................ 330/261; 330/310
(58) Field of Search ........................ 330/252, 253, 330/257, 261, 310

(56) References Cited

U.S. PATENT DOCUMENTS 5,900,781 A * 5/1999 Igarashi et al. ......... 330/310 X
6,445,250 B1 * 9/2002 Aude ........................ 330/253

FOREIGN PATENT DOCUMENTS

| JP | 52-142462 A1 | 11/1977 |
|----|--------------|---------|
| JP | 03-250661 A1 | 11/1991 |

* cited by examiner

*Primary Examiner*—Steven J. Mottola
(74) *Attorney, Agent, or Firm*—Connolly Bove Lodge & Hutz LLP; Larry J. Hume

(57) ABSTRACT

A plurality of transistors Qi (i=1 to n), which are connected to a plurality of differential amplifiers 1, 2, and 3 and which are connected in a multistaged manner and connected to one constant current source 4 by a current mirror, are arranged collectively on an input side of the constant current source 4. Due to this, the wiring length between the constant current source 4 and the transistors Qi is shortened to the utmost, and the stability of circuit can be improved. Also, this can restrict the unfavorableness that noise is superposed on the wiring. Additionally, a voltage drop will not occur due to supplied resistance on the ground line, due to each transistor Qi being grounded to the same place via separate ground lines 6, 7, and 8. Because of this, the current can be supplied from the constant current source 4 to all transistors Qi without breaking the balance of the current mirror.

7 Claims, 3 Drawing Sheets

MULTISTAGED AMPLIFICATION CIRCUIT

CROSS-REFERENCE TO RELATED APPLICATIONS

This application is a continuation under 35 U.S.C. §120 of co-pending International Application PCT/JP02/03619 filed on Apr. 11, 2002 entitled "Multistaged Amplification Circuit", the entire contents of which are incorporated herein by reference, and for which priority is claimed under 35 U.S.C. §119 to Japanese patent application no. 2001-116418, filed on Apr. 16, 2001.

BACKGROUND

The present invention relates to a multistaged amplification circuit. In particular, it is suitable for use for multistaged amplification circuits commonly having a constant current source for bias at each stage.

Generally speaking, electronics devices receiving and processing an RF (Radio Frequency) signal, such as a radio receiver, a cellular phone, a codeless phone, a television receiver, a car navigation system, or a game machine with communication functions, use a differential multistaged amplification circuit (for example, a limiter amplifier, etc.) that enables high gain by multistaged cascade connection of differential amplifiers, in order to regenerate a received small input signal as a square wave.

There are two types of multistaged amplification circuit: one is a multistaged amplification circuit that individually connects a constant current source for a bias to a differential amplifier at each stage, and the other is a multistaged amplification circuit that commonly connects one constant current source to a differential amplifier at each stage. The constant current source is of a larger scale than other components, and the current consumed is also greater. Therefore, when attempting miniaturization or reduction of current consumed, a multistaged amplification circuit that causes the constant current source to be held individually at each stage is not suitable. Thus, a multistaged amplification circuit that commonly connects the constant current source to each stage should be used.

FIG. 1 is a diagram to indicate the structure of a conventional limiter amplifier that commonly has a constant current source at each stage. As shown in FIG. 1, a limiter amplifier is composed of n differential amplifiers 1, 2, and 3 connected in a multistaged manner to the output side from the input side. Each differential amplifier 1, 2, and 3 is composed of differential pairs comprising two resistances $Ri1$ and $Ri2$ ($i=1$ to $n$) and two transistors $Qi1$ and $Qi2$ ($i=1$ to $n$), and transistors $Qi$ ($i=1$ to $n$) switching between such differential pairs.

In the individual differential pairs, the mutual sources of two transistors $Qi1$ and $Qi2$ ($i=1$ to $n$) are commonly connected, and each drain of the transistor $Qi$ ($i=1$ to $n$) is connected with such common sources. Additionally, the drains of the transistors $Qi1$ and $Qi2$ ($i=1$ to $n$) are commonly connected with power VDD, via the resistances $Ri1$ and $Ri2$.

Also, output signals $Vouti$ ($i=1$ to $n-1$) from differential amplifiers at previous stages are inputted to the gates of each transistors $Qi1$ and $Qi2$ except for a differential amplifier 1 at the initial stage. An input signal Vin is inputted to the gates of each transistor Q11 and Q12 of the differential amplifier 1 at the initial stage.

The source of each transistor $Qi$ is commonly grounded via a ground line 5. Additionally, the gate of each transistor $Qi$ is connected to the constant current source 4. Furthermore, the gate of transistor Q1 is connected to the constant current source 4. And such transistor Q1 and each transistor $Qi$ are connected by a current mirror.

In the structured limiter amplifier mentioned above, the signal Vin inputted to the transistors Q11 and Q12 of the differential amplifier 1 at the initial stage is amplified only at a predominated level and outputted. In this circuit, the transistor 11 is outputted in an antiphase manner, and the transistor Q12 is outputted in phase in a common mode manner. The signal Vout1 amplified and outputted here is inputted to each base of transistors Q21 and Q22 of a differential amplifier 2 at the second stage, further amplified and outputted to in the differential amplifier 2.

The same applies hereinafter. That is to say, the signal is amplified in sequence by the differential amplifiers 1, 2, and 3 at each stage. Due to this, the amplitude of the input signal Vin to the differential amplifier 1 at the initial stage becomes larger as it reaches subsequent stages. And the output signal Vout amplified to a predominated level is ultimately obtained.

In the multistaged amplification circuit where a plurality of differential amplifiers are connected in a multistaged manner, when the constant current source is prepared commonly at each stage, such constant current source is normally arranged on the input side or the output side of the multistaged amplification circuit. Thus, for example, when the current constant source 4 is arranged on the input side as in FIG. 1, the wire length of the ground line 5 from the constant current source 4 to the differential amplifiers 1, 2, and 3 becomes longer as it goes to the subsequent stages.

Furthermore, the transistors $Qi$ of each differential amplifier 1, 2, and 3 are grounded through the common ground line 5. Thus, distributed resistance, which becomes larger when going to subsequent stages, occurs on such ground line 5. Due to such distributed resistance, a voltage drop occurs, which becomes larger when going to subsequent stages, the ground level of each transistor $Qi$ is not equal, and the balance of the current mirror is broken. Therefore, an appropriate amount of current cannot be supplied to the differential amplifiers 1, 2, and 3 at each stage in a well-balanced manner, and linearity with good input and output characteristics of the limiter amplifier cannot be preserved.

Also, when the multistaged amplification circuit, such as the limiter amplifier, operates in the high frequency area, and the wiring length becomes longer, the operation becomes accordingly unstable. Simultaneously, noise is easily superposed on the RF signal. The present invention has been made in order to resolve such difficulties. The purpose of the present invention is to preserve the good linearity of the differential amplifiers in a multistaged amplification circuit where differential amplifiers are connected in a multistaged manner, and to realize stability of operations and reduction of noise.

BRIEF SUMMARY

A multistaged amplification circuit of the present invention comprises a differential amplification circuit, equipped with n differential amplifiers that are connected in a multistaged manner and that amplify and output an input signal from a previous stage to a following stage; a plurality of transistors connected to said n differential amplifiers that are connected in a multistaged manner, and connected to one constant current source by a current mirror; and wherein said plurality of transistors are arranged collectively on the side of said constant current source.

In one aspect of the invention, the constant current source is arranged on either an input side or an output side of said differential amplification circuit.

In another aspect of the invention, the constant current source is arranged almost in the center of said n differential amplifiers connected in a multistaged manner.

In another aspect of the invention, the plurality of transistors are grounded to the same place via separate ground lines.

In another aspect of the invention, a differential amplification circuit comprises a differential amplification circuit, equipped with n differential amplifiers that amplify and output an input signal from a previous stage to a following stage, and that are connected in a multistaged manner; a plurality of transistors connected to a plurality of differential amplifiers and one constant current by a current mirror for every group into which said n plurality of differential amplifiers are divided; and wherein said plurality of transistors are arranged collectively on the side of the constant current source for every said group.

In another aspect of the invention, a multistaged amplification circuit of the present invention comprises a differential amplification circuit, equipped with n differential amplifiers that amplify and output an input signal from a previous stage to a following stage, and that are connected in a multistaged manner; a plurality of transistors connected to said n differential amplifiers that are connected in a multistaged manner, and that are connected to one constant current source by a current mirror; and wherein said plurality of transistors are grounded to the same place via separate ground lines.

Based on the structure of the technical means above, the present invention enables the shortening of the wiring length between the constant current sources and a plurality of transistors. Thus, the distributed resistance occurring on the wiring and the voltage drop become as small as possible, and irregularities of the ground level among a plurality of transistors is suppressed.

Additionally, when the constant current source is arranged almost in the center of plurality of differential amplifiers that are connected in a multistaged manner, the wiring lengths between such plurality of transistors and each differential amplifier responding thereto become shorter. Thus, it enables the current to be supplied over the shortest possible distance and in a well-balanced manner from the constant current source to the differential amplification circuit via each transistor.

Also, when a plurality of transistors are grounded to the same place via separate ground lines, no distributed resistance that becomes larger when going to subsequent stages of the differential amplifiers connected in a multistaged manner occurs, and occurrence of a voltage drop can be suppressed.

DETAILED DESCRIPTION (First Embodiment)

Figure 1:
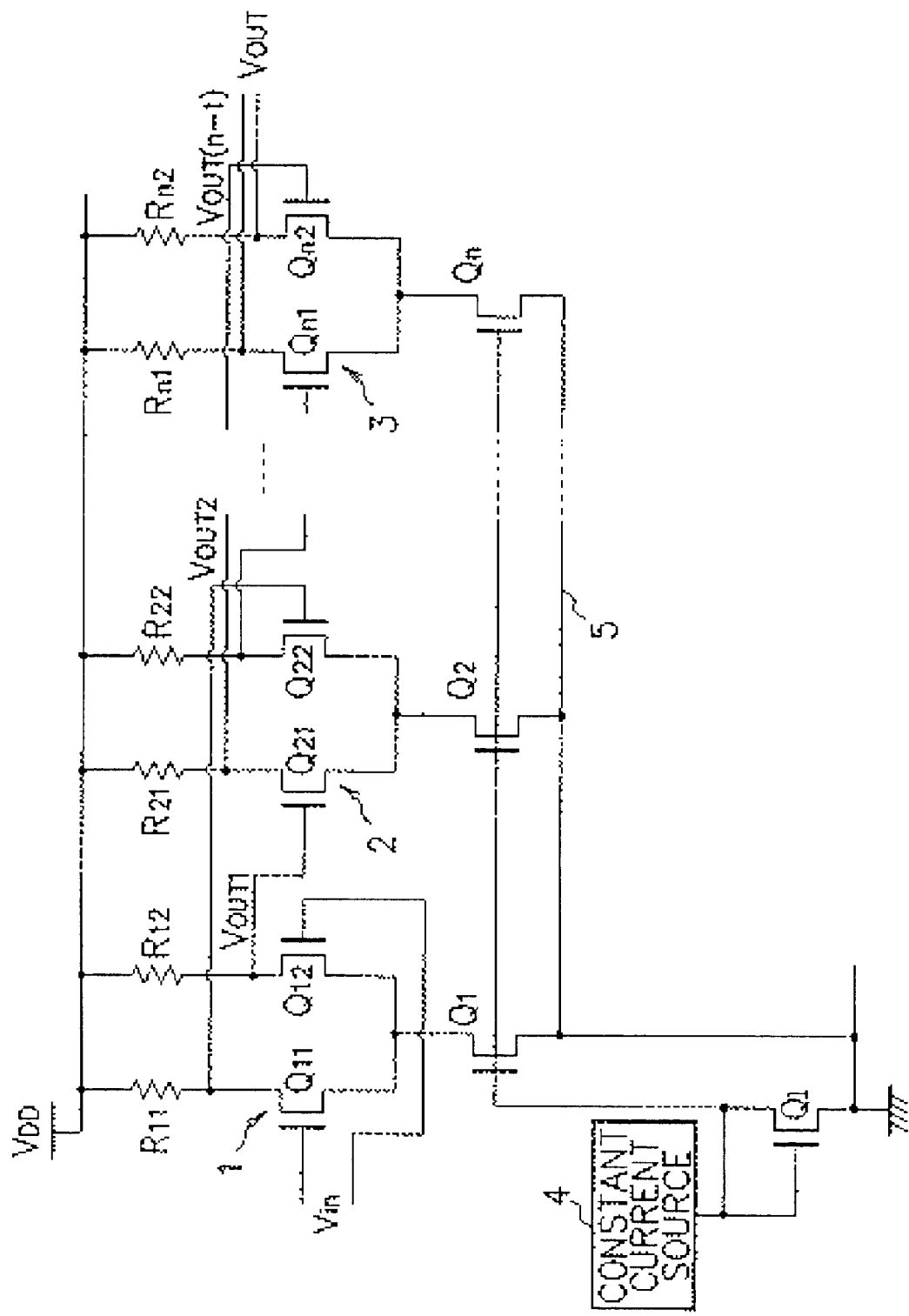
FIG. 1 is a diagram showing the structure of a conventional multistaged amplification circuit.

The first embodiment of the present invention is hereinafter explained with reference to the drawing.

Figure 2:
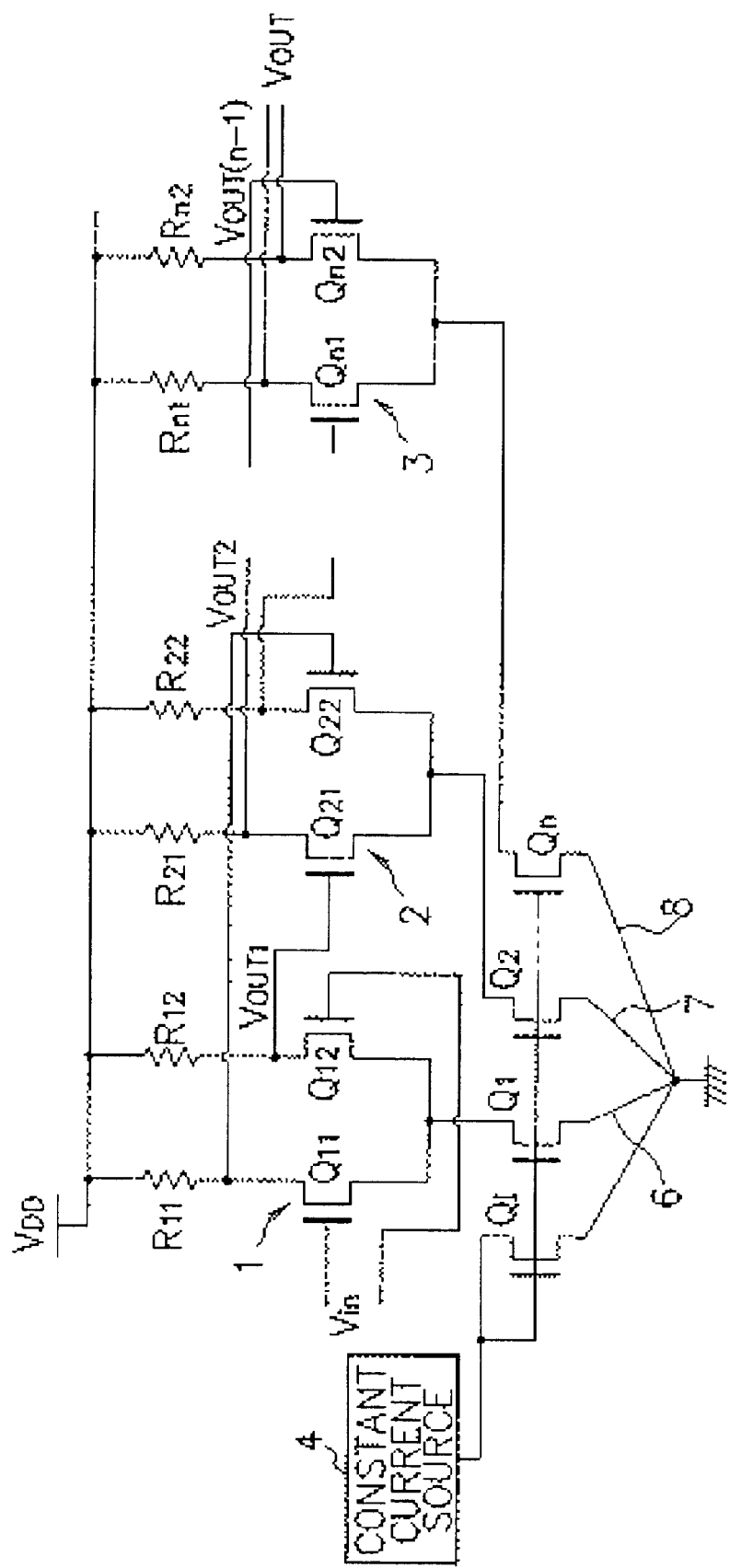
FIG. 2 is a diagram showing the structure of a multistaged amplification circuit of the first embodiment.

FIG. 2 is a diagram showing an example of construction of a multistaged amplification circuit (limiter amplifier) according to the first embodiment.

In addition, for the components in FIG. 2 that are the same as those in FIG. 1, the same references are attached thereto.

As shown in FIG. 2, the limiter amplifier of this embodiment is composed of, n differential amplifiers 1, 2, and 3 constructed in a multistaged manner from the input side to the output side. Each differential amplifier 1, 2, and 3 is composed of differential pairs comprising two resistances, Ri1 and Ri2 (i=1 to n) and two transistors Qi1 and Qi2 (i=1 to n), and transistors Qi (i=1 to n) switching between such differential pairs.

In the individual differential pairs, the mutual sources of two transistors Qi1 and Qi2 (i=1 to n) are commonly connected, and each drain of the transistors Qi (i=1 to n) is connected with such common sources. Additionally, the drains of the transistors Qi1 and Qi2 (i=1 to n) are commonly connected with power VDD, via the resistances Ri1 and Ri2.

Also, except for a differential amplifier 1 at the initial stage, output signals Vouti (i=1 to n−1) are inputted to the gates of transistors Qi1 and Qi2 from differential amplifiers at previous stages. An input signal Vin is inputted to the gates of transistors Q11 and Q12 of the differential amplifier 1 at the initial stage.

The source of each transistor Qi is grounded to the same place via separate ground lines 6, 7, and 8. Also, the gates of all transistors Qi are commonly connected to the constant current source 4. Furthermore, the gate of transistor Q1 is connected to the constant current source 4 as well. Such transistor Q1 and each transistor Qi are connected by a current mirror. Due to this, the current can be supplied to each of the differential amplifiers 1, 2, and 3 from the constant current source 4 in a well-balanced manner.

In the structured limiter amplifier mentioned above, the signal Vin inputted to the transistors Q11 and Q12 of the differential amplifier 1 at the initial stage is amplified at a predominated level and outputted. In this circuit, the transistor Q11 is outputted in an anitiphase manner, and the transistor Q12 is in phase outputted in a common mode manner. The signal Vout1 amplified and outputted here is inputted to the bases of transistors Q21 and Q22 of a differential amplifier 2 at the second stage, further amplified and outputted to in the differential amplifier 2.

The same applies hereinafter. That is to say, the signal is amplified in sequence by the differential amplifiers 1, 2, and 3 at each stage. Due to this, the amplitude of the input signal Vin to the differential amplifier 1 at the initial stage becomes larger as it reaches subsequent stages. And the output signal Vout amplified to a predominated level is ultimately obtained.

In this embodiment, a plurality of transistors Qi connected to the sources of each differential pair are collectively arranged on an input side as closely to the constant current source 4 as possible. Thus, the wiring length of the ground lines 6, 7, and 8 can be shortened compared with the conventional ground line 5. Furthermore, each transistor Qi is grounded to the same place via separate grounds lines 6, 7, and 8. Due to this, the distributed resistance, which becomes larger when going to a subsequent stage of the differential pairs connected in a multistaged manner, can be reduced, and a voltage drop between the differential pairs can be suppressed.

Due to this, the current can be supplied from the constant current source 4 to all transistors Qi without breaking the balance of the current mirror, and further, efficiently and over the shortest possible distance. Thus, regarding the input and output characteristics of the limiter amplifier, good linearity can be preserved. Additionally, since the wiring length from the constant current source 4 to each transistor Qi is shortened, the operations can be stabilized even when using the RF signal. Also, the unfavorableness that noise is superposed on the signal can be suppressed.

In addition, the example of FIG. 2 implements both of the following cases: where the plurality of transistors Qi, which are connected to the sources of each differential pair, are collectively arranged on the input side as closely as possible to the constant current source 4; and where each transistor Qi is grounded to the same place via separate grounds lines 6, 7, and 8. However, even if only one of the above applies, it is possible to expect a certain effect.

That is to say, even only given the condition that the plurality of transistors Qi are collectively arranged on the side of the constant current source 4, the wiring length of the ground lines between the constant current source 4 and each transistor Qi can be shortened, and the distributed resistance and a voltage drop can be as small as possible. Therefore, compared with the conventional art, good linearity can be preserved, and stability of operations in the high frequency area and reduction of noise can be achieved.

On the other hand, even only given the condition that each transistor Qi is grounded to the same place via separate grounds lines 6, 7, and 8, the distributed resistance, which becomes larger when going to a subsequent stage of the differential amplifiers connected in a multistaged manner, can be substantially eliminated. Therefore, occurrence of a voltage drop can be suppressed, and good linearity can be preserved.

(Second Embodiment)

Next, the second embodiment of the present invention is hereinafter explained based on the drawing.

Figure 3:
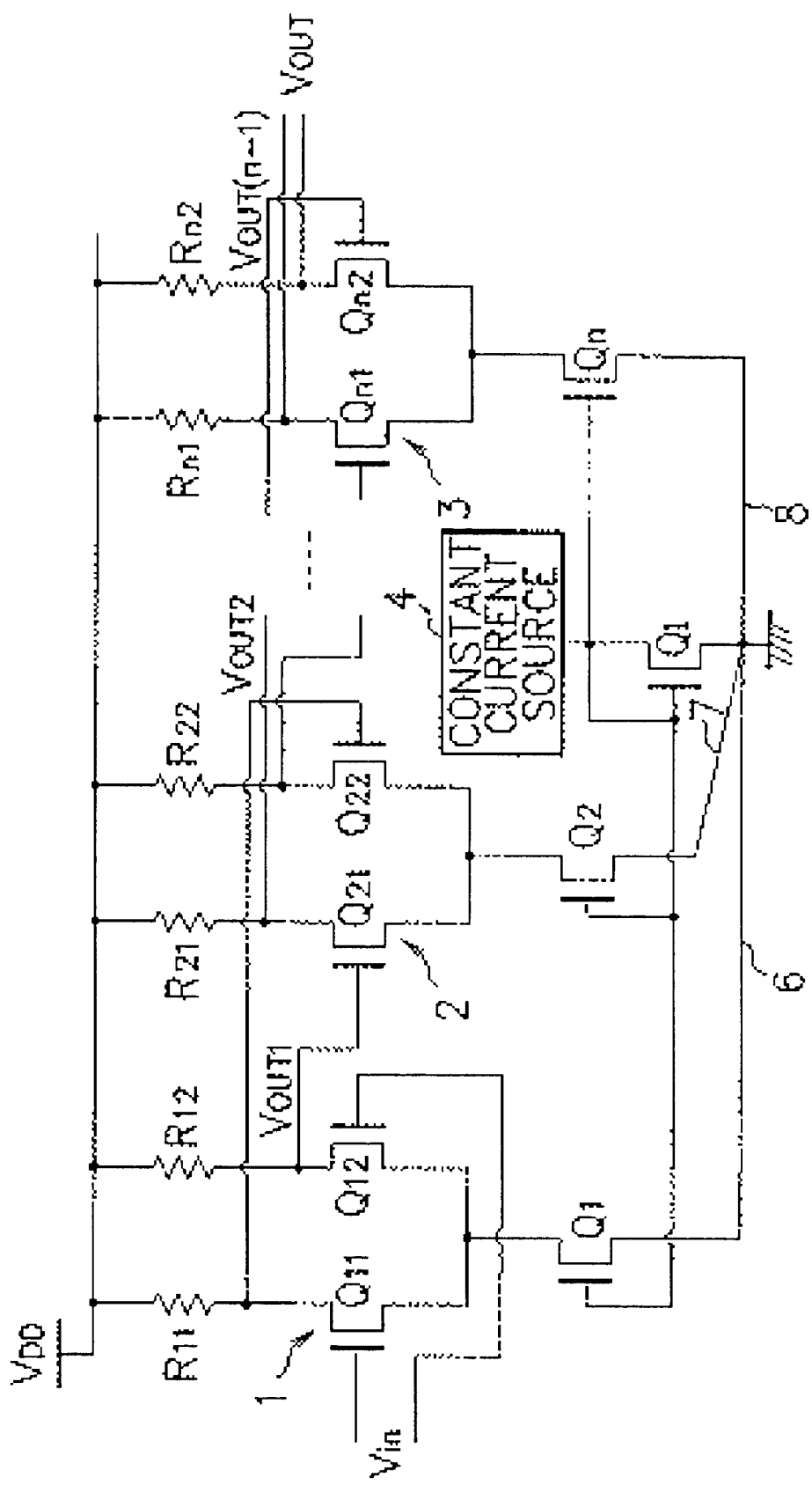
FIG. 3 is a diagram showing the structure of a multistaged amplification circuit of the third embodiment.

FIG. 3 is a diagram showing an example of construction of the multistaged amplification circuit (limiter amplifier) according to the second embodiment. In addition, for the components in FIG. 3 that are the same as those in FIG. 1 and FIG. 2, the same references are attached thereto.

As shown in FIG. 3, the limiter amplifier of this embodiment is composed of n differential amplifiers 1, 2, and 3 connected in a multistaged manner to the output side from the input side. Each differential amplifier 1, 2, and 3 is composed of differential pairs comprising two resistances, Ri1 and Ri2 (i=1 to n) and two transistors Qi1 and Qi2 (i=1 to n), and transistors Qi (i=1 to n) switching between such differential pairs.

In the individual differential pairs, the sources of two transistors Qi1 and Qi2 (i=1 to n) are commonly connected, and each drain of the transistors Qi (i=1 to n) is connected with such common sources. Additionally, the drains of the transistors Qi1 and Qi2 (i=1 to n) are commonly connected with power VDD, via the resistances Ri1 and Ri2.

Also, from differential amplifiers at previous stages, output signals Vouti (i=1 to n−1) are inputted to the gates of transistors Qi1 and Qi2 except for a differential amplifier 1 at the initial stage. An input signal Vin is inputted to the gates of transistors Q11 and Q12 of the differential amplifier 1 at the initial stage.

The source of each transistor Qi is grounded to the same place via separate ground lines 6, 7, and 8. Also, the gates of all transistors Qi are commonly connected to the constant current source 4. Furthermore, the gate of transistor Q1 is connected to the constant current source 4 as well. Such transistor Q1 and each transistor Qi are connected by a current mirror. Due to this, the current can be supplied to each of the differential amplifiers 1, 2, and 3 from the constant current source 4 in a well-balanced manner.

Regarding the limiter amplifier structured as above, the signal Vin inputted to the transistors Q11 and Q12 of the differential amplifier 1 at the initial stage is amplified and outputted only at a predominated level. In this circuit, the transistor Q11 is outputted in an antiphase manner, and the transistor Q12 is outputted in phase in a common mode manner. The signal Vout1 amplified and outputted here is inputted to the base of the transistors Q21 and Q22 of the differential amplifier 2 at the second stage, and is further amplified and outputted in the such differential amplifier 2.

The same applies hereinafter. That is to say, the signal is amplified in sequence by the differential amplifiers 1, 2, and 3 at each stage. Due to this, the amplitude of the input signal Vin to the differential amplifier 1 at the initial stage becomes larger as it reaches subsequent stages. And the output signal Vout amplified to a predominated level is ultimately obtained.

In this embodiment, the constant current source 4 is arranged almost in the center of each differential pair connected in a multistaged manner. In addition, since the plurality of transistors Qi, which are connected to the sources of each differential pair, are collectively arranged on the center side as closely as possible to the constant current source 4, the wiring length of the ground lines 6, 7, and 8 can be shortened compared with the conventional ground line 5. Furthermore, each transistor Qi is grounded to the same place via separate ground lines 6, 7, and 8. Due to this, the distributed resistance, which becomes larger when going to a subsequent stage of the differential pairs connected in a multistaged manner, can be eliminated, and a voltage drop between differential pairs can be suppressed.

Due to this, the current can be supplied from the constant current source 4 to all transistors Qi without breaking the balance of the current mirror, and further, efficiently and over the shortest possible distance. Thus, regarding the input and output characteristics of the limiter amplifier, good linearity can be preserved.

Additionally, in the embodiment, the current can be also supplied from each transistor Qi to each differential amplifier 1, 2, and 3 responding thereto, efficiently and over the shortest possible distance. Thus, the operations in the high frequency area can be always stabilized, and occurrence of noise can be further suppressed.

In addition, the example of FIG. 3 implements both of the following cases: where the plurality of transistors Qi, which are connected to the sources of each differential pair, are collectively arranged on the input side as closely as possible to the constant current source 4; and where each transistor Qi is grounded to the same place via separate grounds lines 6, 7, and 8. However, even if only one of the above applies, it is possible to expect a certain effect.

Additionally, in the first and second embodiments mentioned above, nMOS transistors are used as transistor elements composed of a multistaged amplification circuit. The multistaged amplifier may be structured by using pMOS transistors.

Also, the aforementioned embodiments have shown a circuit that commonly has one constant current source to the n differential amplifiers 1, 2, and 3. However, the present invention is not limited thereto. For example, the n differential amplifiers 1, 2, and 3 may be divided into a plurality of groups, and a constant current source may be prepared for every group. In such case, the plurality of transistors connected to the plurality of differential amplifiers and one constant current source by a current mirror are collectively arranged on the side of each constant current source.

The embodiments explained above have shown only one example of the possible incarnations upon implementing the present invention. This should not cause the technical scope of the present invention to be restrictively interpreted. That is to say, the present invention can be implemented in various forms, without deviating from the spirit or the main characteristics thereof.

As explained above, regarding the present invention, the plurality of transistors, which are connected to the n differential amplifiers connected in a multistaged manner, and the constant current source by a current mirror, are arranged collectively on the side of the constant current source, the wiring length between the constant current source and the plurality of transistors can be shortened to the utmost, and the distributed resistance occurring on the wiring and the voltage drop become as small as possible. Due to this, the current can be supplied from the constant current source to all transistors without breaking the balance of the current mirror. Thus, regarding the input and output characteristics of the multistaged amplification circuit, good linearity can be preserved. Also, this can improve the stability of the circuit, and restrict the unfavorableness that noise is superposed on the wiring.

According to another aspect of the present invention, the constant current source is arranged almost in the center of the plurality of differential amplifiers connected in a multistaged manner. Thus, the wiring length between the plurality of transistors and each of the differential amplifiers responding thereto is also shortened, and the current can be supplied from the constant current source to the differential amplification circuit via each transistor at the shortest possible distance and in a well-balanced manner. Also, this can accurately restrict the unfavorableness that noise is superposed on the wiring. Furthermore, this enables improvements of the stability of the circuit.

According to another aspect of the present invention, since each transistor is grounded to the same place via separate grounds lines, no distributed resistance, which becomes larger when going to a subsequent stage of the differential amplifiers connected in a multistaged manner, can occur. Therefore, the occurrence of a voltage drop can be suppressed. Due to this, the current can be supplied from the constant current source to all transistors without breaking the balance of the current mirror, and further, at the shortest possible distance. Thus, regarding the input and output characteristics for the multistaged amplification circuit, good linearity can be preserved.

INDUSTRIAL APPLICABILITY

The present invention is useful in that good linearity can be preserved, and stability of operations and reduction of noise can be realized regarding a multistaged amplification circuit where the differential amplifiers are connected in a multistaged manner.

What is claimed is:

1. A multistaged amplification circuit comprising:

a differential amplification circuit, equipped with n differential amplifiers that are connected in a multistaged manner and that amplify and output an input signal from a previous stage to a following stage;

a plurality of transistors connected to said n differential amplifiers that are connected in a multistaged manner, and connected to one constant current source by a current mirror; and a plurality of separate ground lines, wherein each of said plurality of transistors is connected to a common ground node by a dedicated one of the plurality of separate ground lines.

2. The multistaged amplification circuit of claim 1, wherein the plurality of separate ground lines collectively suppress a distributed voltage drop.

3. A multistaged amplification circuit, comprising:

a differential amplification circuit, equipped with n differential amplifiers that amplify and output an input signal from a previous stage to a following stage, and that are connected in a multistaged manner;

a plurality of transistors connected to a plurality of differential amplifiers and one constant current by a current mirror for every group into which said n plurality of differential amplifiers are divided; and means for suppressing a ground line distributed voltage drop associated with each of the plurality of transistors, wherein the means for suppressing a distributed voltage drop comprises a plurality of separate ground lines, wherein each of said plurality of transistors is connected to a common ground node by a dedicated one of the plurality of separate ground lines.

4. The multistaged amplification circuit of claim 3, wherein the means for suppressing a ground line distributed voltage drop reduces electrical noise.

5. The multistaged amplification circuit of claim 3, wherein the means for suppressing a ground line distributed voltage drop preserves linearity of an amplified signal.

6. The multistaged amplification circuit of claim 3, wherein the means for suppressing a ground line distributed voltage drop stabilizes a high frequency operating characteristic of the multistaged amplification circuit.

7. The multistaged amplification circuit of claim 3, wherein the means for suppressing a ground line distributed voltage drop reduces electrical noise, preserves linearity of an amplified signal, and stabilizes a high frequency operating characteristic of the multistaged amplification circuit.

* * * * *